United States Patent

Arai

[19]

[11] Patent Number: 5,887,010
[45] Date of Patent: Mar. 23, 1999

[54] SEMICONDUCTOR LASER CONTROL CIRCUIT WHICH SETS THE OPTICAL OUTPUT POWER OF A LASER BY MEANS OF TEST LIGHT EMISSION IN AN AREA OTHER THAN ALPC AREAS

[75] Inventor: Kazuma Arai, Hachioji, Japan

[73] Assignee: Olympus Optical Co., Ltd., Tokyo, Japan

[21] Appl. No.: 788,337

[22] Filed: Jan. 27, 1997

[51] Int. Cl.[6] ........................................................ H01S 3/00
[52] U.S. Cl. ................................................. 372/38; 372/25
[58] Field of Search ......................................... 372/38, 25

[56] References Cited

FOREIGN PATENT DOCUMENTS 2-68736   3/1990   Japan .
63-220951 8/1990   Japan ............................ G11B 7/125

Primary Examiner—Leon Scott, Jr.
Attorney, Agent, or Firm—Armstrong, Westerman, Hattori, McCleland & Naughton

[57] ABSTRACT

Test light emitting operation is performed in test zones or manufacturer zones formed across 100 or more tracks in a non-user area in an inner or outer disk portion. The optical output power is set successively for output currents Iw0, Iw1, and Iw2 during the above test light emitting operation. In an operation in a write mode, a CPU sets a W0-D/A converter, a W1-D/A converter, W2-D/A converter so that a W0-constant current circuit, a W1-constant current circuit, and a W2-constant current circuit can provide currents in accordance with the outputs of the respective D/A converters. Three switches are turned on and off in response to write data thereby supplying a driving current to a laser diode. Thus, the laser diode is driven by a multiple-level driving current using a simple low-frequency-band circuit without having to perform power setting operation in an ALPC area of an optical recording medium.

7 Claims, 12 Drawing Sheets

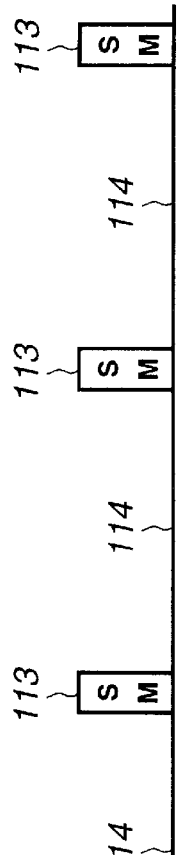
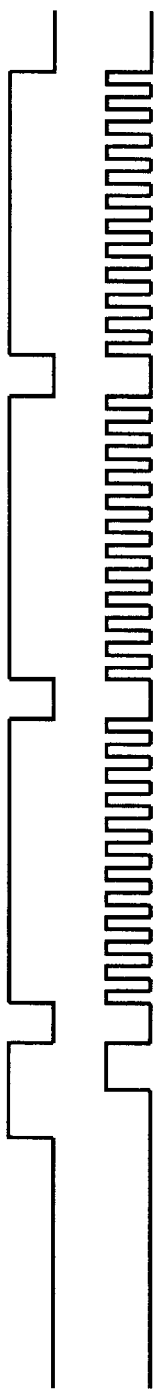
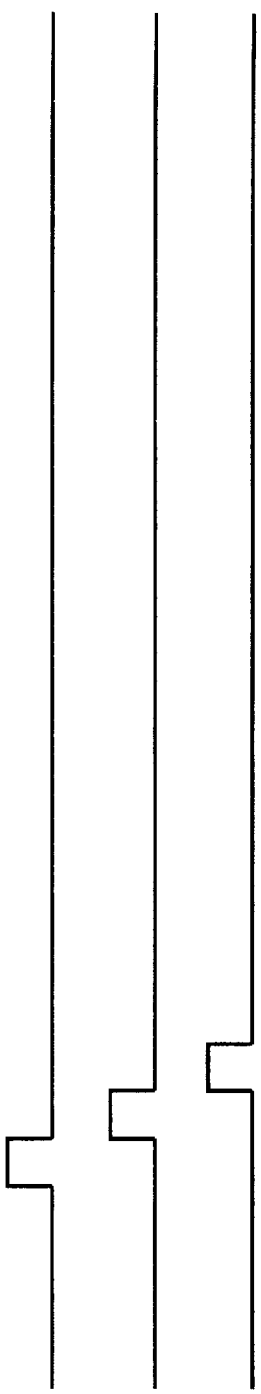
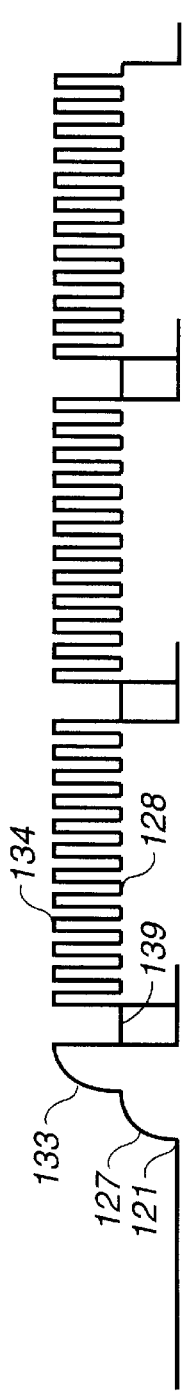
PRIOR ART
FIG.13(a)
FIG.13(b)
FIG.13(c)
FIG.13(d)
FIG.13(e)
FIG.13(f)
FIG.13(g)

5,887,010

SEMICONDUCTOR LASER CONTROL CIRCUIT WHICH SETS THE OPTICAL OUTPUT POWER OF A LASER BY MEANS OF TEST LIGHT EMISSION IN AN AREA OTHER THAN ALPC AREAS

BACKGROUND OF THE INVENTION

1. Field of the Invention

The present invention relates to a semiconductor laser control circuit for controlling the laser beam emitted by a semiconductor laser to illuminate an optical recording medium.

2. Related Art Statement

A mark edge recording technique is known as a high-density optical-disk recording technique. In this technique, if a laser is driven by a laser driving current with a simple pulse waveform, accumulation of heat occurs, which causes recorded marks to be distorted into the shape of a teardrop. This distortion causes a problem particularly in the mark edge recording scheme in which data is represented by the length of each recorded mark. That is, the distortion in the mark shape can result in an increase in error during a reproducing operation. One known technique for avoiding the above problem is to drive a laser at a plurality of power levels as shown in FIG. 11. This technique is known as the recording waveform correction.

A semiconductor laser control circuit for achieving the multiple-power-level recording is disclosed for example in Japanese Unexamined Patent Publication No. 2-68736.

In this semiconductor laser control circuit disclosed in Japanese Unexamined Patent Publication No. 2-68736, as shown in FIG. 12, the optical output of a semiconductor laser 101 is detected by a photo detector 102, and the detected signal in current form is converted into voltage form by an operational amplifier 103. The output of the operational amplifier is applied as an optical power control error signal 109 to operational amplifiers 110, 111, and 112 which form a servo system.

In a typical format used in a magneto-optic recording disk, a sector includes a plurality of recording areas (hereafter referred to as MO areas) 114, as shown in FIG. 13(a). Each sector includes preformatted sector marks (SM) 113 located immediately in front of the respective MO areas 114, wherein each sector mark 113 is made for example in the form of a wobble pit by which tracking servo control is performed. Following the first sector mark 113, there are provided a sector address (AD) area 115 and an ALPC (auto laser power control) area 116 wherein the sector address area 115 indicates the sector address and the ALPC area is used to set the optical power levels in reproducing, erasing, and recording operations. FIG. 13(g) illustrates the waveform of the optical output of the semiconductor laser 101 whose output levels are set in the ALPC area.

In FIG. 12, when a reproduction sample gate signal 117 is at a high level, a reproduction sample-and-hold circuit 119 performs a sampling operation. The operational amplifier 110 compares the optical power control error signal 109 with a reproduction reference voltage 118. In accordance with the comparison output of the operational amplifier 110, a reproducing current source 120 is driven, and thus the DC optical-power in the reproducing operation is set to a corresponding level (as represented by reference numeral 121 in FIG. 13(g)). When the reproduction sample gate signal 117 is at a low level, the reproduction sample-and-hold circuit 119 holds the signal received from the operational amplifier 110 so that the DC optical-output power is maintained at the fixed level (as denoted by reference numeral 122 in FIG. 13(g)). The waveform of the reproduction sample gate signal 117 is shown in FIG. 13(d).

In FIG. 12, when a bottom-value sample gate signal 123 is at a high level, a bottom-value sample-and-hold circuit 124 performs a sampling operation. The operational amplifier 111 compares the optical power control error signal 109 with a bottom-value reference voltage 125. In accordance with the comparison output of the operational amplifier 111, a bottom-value current source 126 is driven, and thus the DC bottom-value optical-power (in the erasing operation) is set to a corresponding level (as shown by reference numeral 126 in FIG. 13(g)). When the bottom-value sample gate signal 123 is at a low level, the bottom-value sample-and-hold circuit 124 holds the signal received from the operational amplifier 111 so that the DC bottom-value optical-output power is maintained constant (as denoted by reference numeral 128 in FIG. 13(g)). The waveform of the bottom-value sample gate signal 123 is shown in FIG. 13(e).

In FIG. 12, when a peak-level sample gate signal 129 is at a high level, a peak-value sample-and-hold circuit 130 performs a sampling operation. The operational amplifier 112 compares the optical power control error signal 109 with a peak-value reference voltage 131. In accordance with the comparison output of the operational amplifier 112, a peak-value current source 132 is driven, and thus the DC peak-value optical-power (in the recording operation) is set to a corresponding level (as represented by reference numeral 133 in FIG. 13(g)). When the peak-value sample gate signal 129 is at a low level, the peak-value sample-and-hold circuit 130 holds the signal received from the operational amplifier 112 so that the DC peak-value optical-output power is maintained constant (as denoted by reference numeral 134 in FIG. 13(g)). The waveform of the peak-value sample gate signal 129 is shown in FIG. 13(f).

A modulator stage 135 modulates the optical output power by driving the semiconductor laser 101 with pulse currents having fixed peak and bottom values in accordance with the recording signal 136 as shown in FIG. 13(c). In response to a write gate signal 137, a gate 138 performs gating operation in terms of the recording signal 136. The write gate signal 137 is also used to control the on/off operation of the bottom-value current source switch 139. The waveform of the write gate signal 137 is shown in FIG. 13(b).

In the conventional technique, as described above, it is required that the power level be set by performing test light emission in an ALPC area disposed between a preformatted area and an MO area in a sector as shown in FIG. 13(a) using a circuit such as that shown in FIG. 12. Thus, it is required to set the power for the three different levels in the ALPC area to obtain a corrected recording waveform (write current waveform) such as that shown in FIG. 11.

In the case of a single-hole recording technique in which recording is performed with a single-level optical power, it is possible to set the power in the ALPC.

However, if the circuit shown in FIG. 12 is applied to a high-density recording disk (according to the long-pit Z-CAV recording scheme), the ALPC has only 6 bytes (72 channel bits) in the case of a 130-mm 2.6-GB magneto-optic disk (according to the standard SC23/WG2N 776) as shown in Table 1.

TABLE 1

| Gap | Flag | Gap | ALPC |
|-----|------|-----|------|
| 5   | 5    | 2   | 6    |

In this standard, if the disk rotation speed is selected to 3600 rpm, the channel clock frequency at the outermost zone (33 bands, 1024-byte/sector) of the Z-CAV disk is as high as 67 MHz and the ALPC passing time is as short as 1.075 psec.

To successfully perform the power setting for all the three levels shown in FIG. 11, it is required to complete the power setting for each level in about 300 nsec ($\approx 1.075$ $\mu$sec/3). To achieve ±1% accuracy in the above power setting, the semiconductor laser APC (auto power control) loop for each channel in FIG. 12 is required to have a wide frequency bandwidth greater than 17 MHz (17 MHz$\approx$(300 nsec/5)$^{-1}$). This bandwidth is nearly equal to the RF bandwidth of an optical disk recording/reproducing apparatus.

Therefore, it is required that all circuit sections, such as the photo detector for monitoring the semiconductor laser output, current-to-voltage conversion circuit, operating circuit, sample-and-hold circuit, be constructed with components capable of operating in the wide frequency band. Furthermore, three sets of such the wide-band circuit is needed for the respective output levels. This causes the circuit to be complex and expensive.

OBJECTS AND SUMMARY OF THE INVENTION

It is an object of the present invention to provide a semiconductor laser control circuit having a simple circuit configuration with a low frequency band and capable of driving a semiconductor laser with a multiple-level driving current without having to perform ALPC-area power setting operation.

It is another object of the present invention to provide a semiconductor laser control circuit having a low-frequency-band APC circuit composed of a single semiconductor laser monitoring circuit (including a photo detector and an I/V converter circuit) and a single operation circuit and capable of controlling a semiconductor laser at a plurality of output levels.

It is still another object of the present invention to provide a semiconductor laser control circuit in which a plurality of laser diode driver circuit stages have the same gain so that the output power level may be easily set using the optimized semiconductor laser output setting values which have been determined in advance thereby ensuring that power level setting can be performed easily in test light emission.

To achieve the above objects, a semiconductor control circuit of the invention includes: a semiconductor laser for illuminating an optical recording medium with a laser beam; a plurality of pulse current supplying means for supplying a semiconductor laser driving current to the semiconductor laser thereby driving the semiconductor laser; current setting means for setting the semiconductor laser driving current of the plurality of pulse current supplying means; control means for controlling the setting operation of the current setting means; photo detector means for detecting the laser beam output by the semiconductor laser; current-to-voltage conversion means for converting a current signal supplied from the photo detector means into a voltage signal; wherein said control means specifies in advance the setting value to which the semiconductor laser driving current should be set by the current setting means in a predetermined area of the optical recording medium; compares the output of the current-to-voltage conversion means with predetermined data; corrects the setting value of the current setting means in accordance with the comparison result; stores the corrected setting value; and controls the setting operation performed by the current setting means in a recording area of the optical recording medium in accordance with the stored setting value.

These and other features and advantages of the present invention will be more readily apprehended from the following detailed description.

BRIEF DESCRIPTION OF THE DRAWINGS

FIGS. 1 to 7 relate to a first embodiment of the present invention wherein:

FIG. 1 is a circuit diagram illustrating the construction of a semiconductor laser control circuit;

FIG. 2 is a timing chart illustrating the timing associated with the signal generated by the semiconductor laser control circuit shown in FIG. 1;

FIG. 3 is a flow chart illustrating the procedure of test light emission for setting the read power level with the semiconductor laser control circuit shown in FIG. 1;

FIG. 4 is a flow chart illustrating the procedure of test light emission for setting the write power level with the semiconductor laser control circuit shown in FIG. 1;

FIG. 5 is a flow chart illustrating the details of the procedure of setting the optical power level W0 shown in FIG. 4;

FIG. 6 is a flow chart illustrating the details of the procedure of setting the optical power level W1 shown in FIG. 4;

FIG. 7 is a flow chart illustrating the details of the procedure of setting the optical power level W2 shown in FIG. 4;

FIG. 13(a) illustrates the format of a magneto-optic disk which is illuminated by a laser beam emitted by a semiconductor laser controlled by the semiconductor laser circuit shown in FIG. 12; FIG. 13(b) illustrates the waveform of the write gate signal generated in the semiconductor laser control circuit shown in FIG. 12; FIG. 13(c) illustrates the waveform of the recording signal generated in the semiconductor laser control circuit shown in FIG. 12; FIG. 13(d) illustrates the waveform of the reproduction sample gate signal generated in the semiconductor laser control circuit shown in FIG. 12; FIG. 13(e) illustrates the waveform of the bottom-value sample gate signal generated in the semiconductor laser control circuit shown in FIG. 12; FIG. 13(f)

illustrates the waveform of the peak-value sample gate signal generated in the semiconductor laser control circuit shown in FIG. 12; and FIG. 13(g) illustrates the waveform of the optical output of the semiconductor laser driven by the semiconductor laser control circuit shown in FIG. 12.

DETAILED DESCRIPTION OF THE PREFERRED EMBODIMENTS

The present invention will be described in greater detail below with reference to preferred embodiments in conjunction with the accompanying drawings.

First Embodiment:

(Construction)

Figure 1:
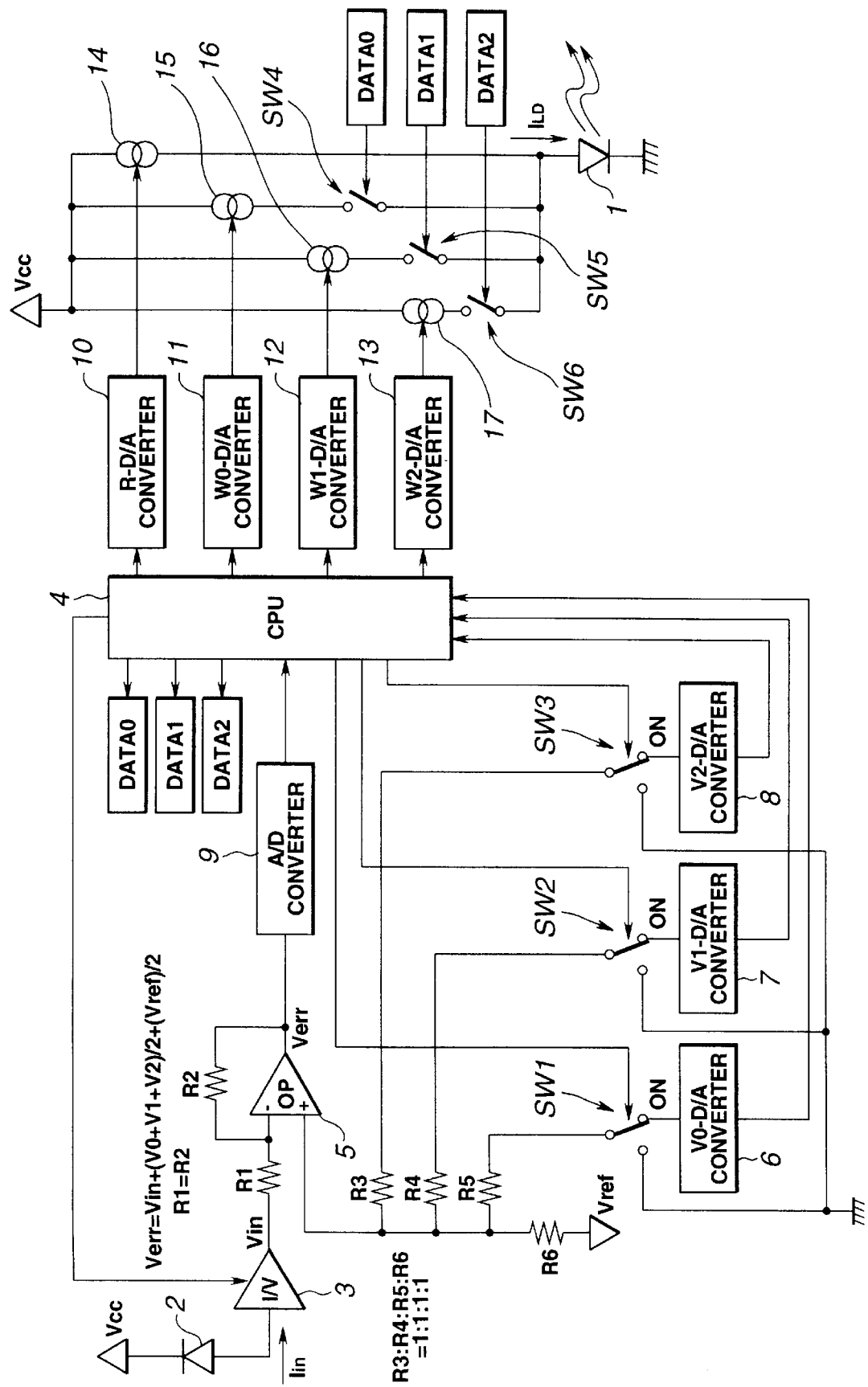

In a semiconductor laser driving circuit according to a first embodiment of the invention, as shown in FIG. 1, the optical output of a semiconductor laser (LD) 1 is detected by a photo detector 2 and the detected signal in current form is converted into voltage form by a current-to-voltage conversion circuit 3 wherein the conversion gain of the current-to-voltage conversion circuit 3 is selected from two or more available values in accordance with the output mode of the laser diode 1. That is, a CPU 4 sets the current-to-voltage conversion circuit 3 to have a high gain when the optical output power of the laser diode 1 is at a read-mode level (low level) whereas the current-to-voltage conversion circuit is set have a low gain when the optical output power of the laser diode 1 is at a write/erase-mode level (high level). This allows three digital-to-analog converters for specifying the optical output power level to be used both in read and write/erase operation modes. The voltage signal output by the current-to-voltage conversion circuit 3 is applied to the negative input terminal of an operational amplifier (OP) 5 via a resistor R1. The positive input terminal of the operational amplifier 5 is connected to a reference voltage (Vref) via a resistor R6 and is also connected to three digital-to-analog converters, that is, a V0-D/A converter 6, V1-D/A converter 7, and V2-D/A converter 8, via resistors R3, R4, and R5 and via switches SW1, SW2, and SW3, respectively. The values of the resistors are set as follows:

R1=R2 and R3=R4=R5=R6.

In accordance with a control signal generated by the CPU 4, the switches SW1, SW2, and SW3 operate so that one end of each resistor R1, R2, and R3 is either grounded or connected to the V0-D/A converter 6, V1-D/A converter 7, and V2-D/A converter 8. The CPU 4 also sets the output levels of the respective V0-D/A converter 6, V1-D/A converter 7, and V2-D/A converter 8.

The output of the operational amplifier 5 is applied to an analog-to-digital (A/D) converter 9. The analog-to-digital converter 9 converts the received signal into digital form and supplies the resultant digital signal to the CPU 4. Depending on the output of the operational amplifier 5, the CPU 4 sets an R-constant current circuit 14, W0-constant current circuit 15, W1-constant current circuit 16, and W2-constant current circuit for driving the semiconductor laser via R-D/A converter 10, W0-D/A converter 11, W1-D/A converter, and W2-D/A converter 12 serving as digital-to-analog converters for setting the semiconductor laser driving current for each of operation modes including read, write, and erase modes.

(Operation)

The operation will now be described below for each mode. In the read mode, the power is set as follows. The CPU 4 sets the switches SW1, SW2, and SW3 so that the SW1 is connected (turned on) to the V0-D/A converter 6, and the switches SW2 and SW3 are connected to ground. The CPU 4 also sets the switches SW4, SW5, and SW6 into OFF states (open states), and sets the gain of the current-to-voltage conversion circuit 3 to a read-mode gain.

Furthermore, the CPU 4 sets the V0-D/A converter 6 so that its output corresponds to a target power and also sets the R-D/A converter 10 so that the R-constant current circuit 14 can provide an output current in accordance with the output of the R-D/A converter 10.

In the above setting, the output of the R-D/A converter 10 is set to a value which has been determined and stored (learned) in the CPU 4 during a test light emitting operation performed in advance, as will be described later. The light emission in the read mode is performed in accordance with the above conditions.

During the light emitting operation in the read mode, the CPU 4 periodically checks the output of the operational amplifier 5 via the A/D converter 9 and corrects the setting of the R-D/A converter 10 so that the output of the A/D converter 9 is maintained within a predetermined allowable bit range (so that the output of the operational amplifier 5 becomes equal to Vref/2). In this operation, the output of the R-D/A converter specifying the output current may be corrected each time the output of the A/D converter 9 is checked at the predetermined constant time intervals or may also be corrected to an optimum value determined by the CPU 5 by means of averaging a plurality of output values of the A/D converter 9.

In the write/erase mode, the output currents Iw0, Iw1, and Iw2 are set separately, as in the read mode, to values which have been determined by a test light emitting operation performed in advance as will be described later so that the optical output power is set by the CPU to an optimum value (in accordance with the outputs of the W0-D/A converter 11, W1-D/A converter 12, and W2-D/A converter 139 for each recording area (zone)).

In the erase-mode operation, the CPU 4 sets the W0-D/A converter 11, W1-D/A converter 12, and the W2-D/A converter 13 so that the corresponding constant current circuits can provide specified currents. The CPU 4 turns on the switches SW4 and SW5 in response to the erase gate.

Although in this specific embodiment the W0-constant current circuit 15 and the W1-constant current circuit 16 are employed as the erase current supplying circuits, other combinations of constant current circuits for example either the W0-constant current circuit 15 and the W2-constant current circuit 17 or all the W0-constant current circuit 15, the W1-constant current circuit, and the W2-constant current circuit 17 may also be employed. In any case, the R-constant current circuit 14 is used to supply a bias current (threshold current) to the laser diode.

In the write-mode operation, the CPU 4 sets the W0-D/A converter 11, W1-D/A converter 12, and the W2-D/A converter 13 so that the W0-constant current circuit 15, the W1-constant current circuit, and the W2-constant current circuit 17 provide specified currents.

Figure 2:
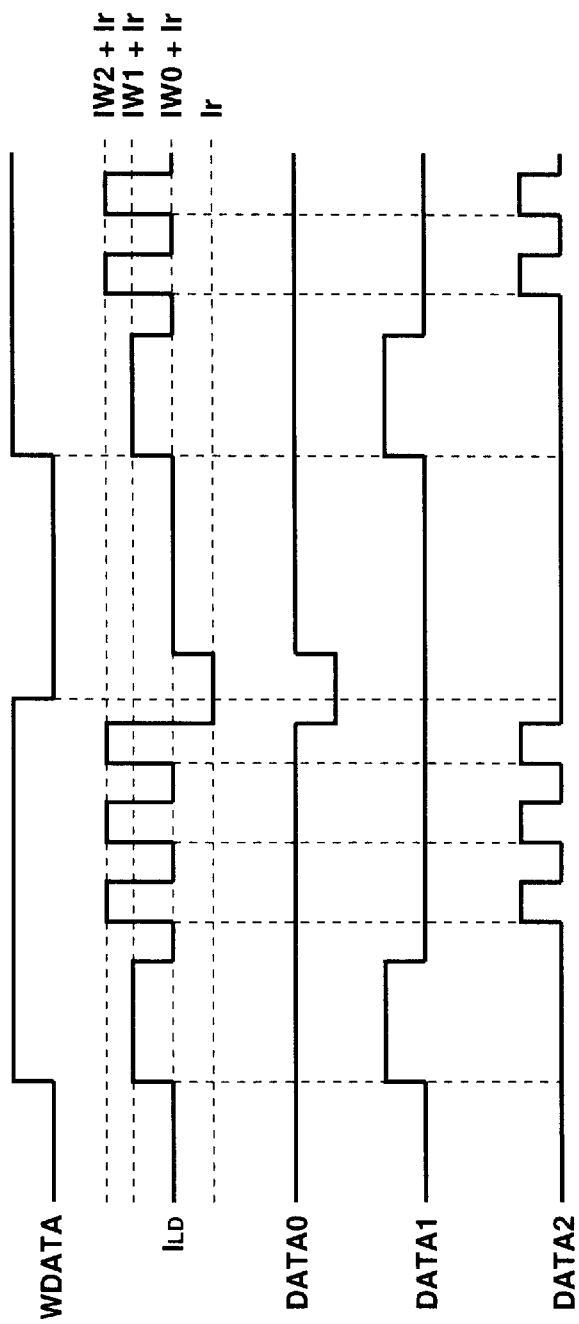

The CPU 4 turns on and off the switches SW4, SW5, and SW6 in response to the write data thereby supplying the driving current ILD to the laser diode 1 as shown in FIG. 2. That is, as shown in FIG. 2, the switches SW4, SW5, and SW6 turn on and off in response to DATA1, DATA2, and DATA3 which are generated by the CPU 4 in accordance with write data (WDATA), thereby supplying the driving current ILD via the W0-D/A converter 11, W1-D/A converter 12, and W2-converter 13.

In this invention, the test light emitting operation is performed in predetermined test zones or manufacturer zones disposed across 100 or more tracks in a non-user area in an inner or outer disk portion. In the test light emitting operation, as will be described in detail below, there is no strict time limitation as opposed to the operation in the ALPC areas.

Referring to the flow chart in FIG. 3, the test light emitting operation for setting the power levels will be described below. In this specific embodiment, it is assumed that the output currents are set such that Iw0≦Iw1≦Iw2.

Figure 3:
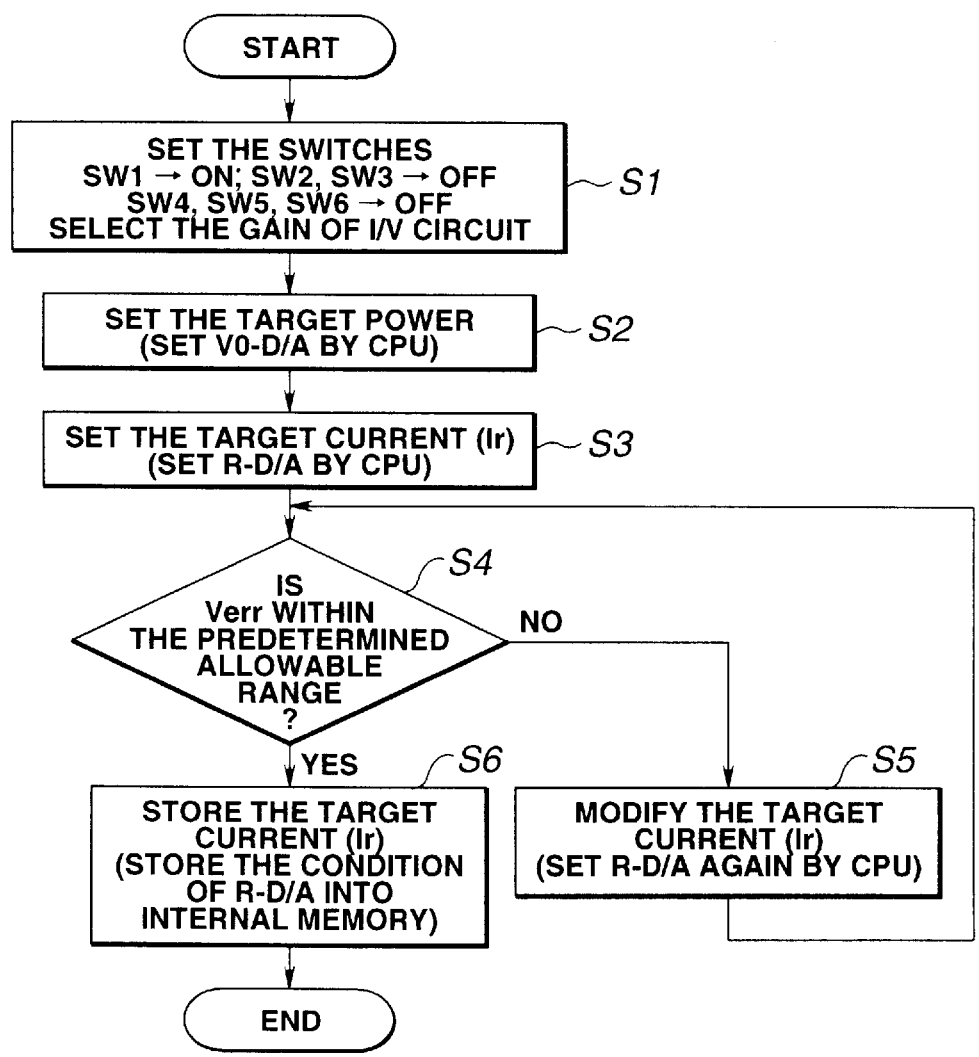

In step S1 in the flow chart of FIG. 3, the CPU 4 sets the switches SW1, Sw2, and SW3 so that the SW1 is connected (turned on) to the V0-D/A converter 6, and the switches SW2 and SW3 are connected to ground. The CPU 4 also sets the switches SW4, SW5, and SW5 into OFF states (open states), and sets the gain (transimpedance) of the current-to-voltage conversion circuit 3 to a read-mode gain. Before the above setting operation, the output currents Ir, Iw0, Iw1, and Iw2 of the R-constant current circuit 14, W0-constant current circuit 15, W1-constant current circuit 16, W2-constant current circuit 17 are all maintained at 0 [mA].

In step S2, the CPU 4 refers to the read power setting table stored in a memory (not shown) provided inside or outside the CPU 4 so as to detect the optimum read power (hereafter referred to as the target read power Pr') depending on the type of an inserted disk and the temperature inside the drive. The CPU 4 sets the V0-D/A converter 6 so that its output corresponds to the target read power Pr'.

Then in step S3, the CPU 4 sets the R-D/A converter 10 so that the R-constant current circuit 14 can provide a proper output current in accordance with the output of the R-D/A converter 10.

The initial setting value of the R-D/A converter 10 is selected so that the read power does not exceed the target read power Pr' even when the read power control loop gain becomes maximum as a result of variations in parameters such as the gain of the laser diode driving circuit, the current-to-light conversion efficiency of the laser diode, the light-to-current conversion efficiency of the photo detector, the gain of the current-to-voltage conversion circuit 3, and the gain of the operational amplifier 5.

In step S4, the CPU 4 checks the output of the operational amplifier 5 via the A/D converter 9 and judges whether the output of the A/D converter 9 is within the predetermined allowable bit range. If no then the process goes to step S5 so as to correct the setting of the R-D/A converter 10 so that the output of the A/D converter 9 falls within the allowable bit range.

In the specific embodiment shown in FIG. 1, $$R1=R2 \text{ and } R3=R4=R5=R6$$

and thus the output (Verr) of the operational amplifier 5 is given by $$Verr=-Vin+(V0+V1+V2)+(Vref/2).$$

Since V1 and V2 are both equal to zero in the above equation, the setting of the R-D/A converter 10 may be corrected so that the Vin becomes equal to V0, that is, the output of the operational amplifier 5 becomes equal to Vref/2.

If it is concluded in step S4 that the output of the A/D converter 9 falls within the allowable bit range, the process goes to step S6 in which the CPU 4 stops checking the output of the R-D/A converter 10 and stores the setting value associated with the R-D/A converter 10 as the optimum read power Pr in the reading operation into the memory (not shown) provided inside or outside the CPU 4. Thus, the test light emitting operation for setting the read power Pr or the output current Ir is completed.

Figure 4:
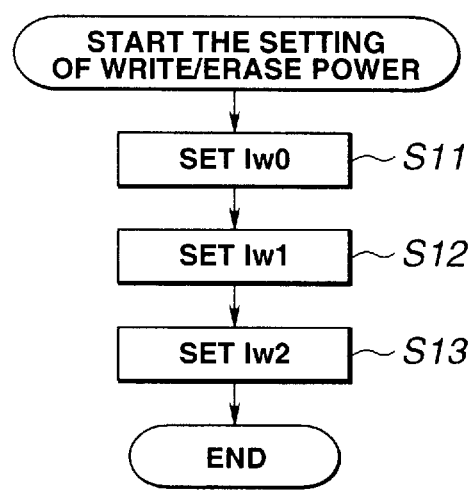

The test light emitting operation for setting write power is performed as shown in the flow chart of FIG. 4, in which the output currents Iw0, Iw1, and Iw2 are set one by one in steps S11–S13 as described in detail below.

In the write mode, the CPU 4 sets the W0-D/A converter 11, W1-D/A converter 12, and the W2-D/A converter 13 so that the W0-constant current circuit 15, the W1-constant current circuit, and the W2-constant current circuit 17 provide specified currents.

Then the CPU 4 turns on and off the switches SW4, SW5, and SW6 in response to the write data thereby supplying driving current to the laser diode 1 as shown in FIG. 2.

(1) Setting of the output current Iw0 of the W0-constant current circuit 15

Figure 5:
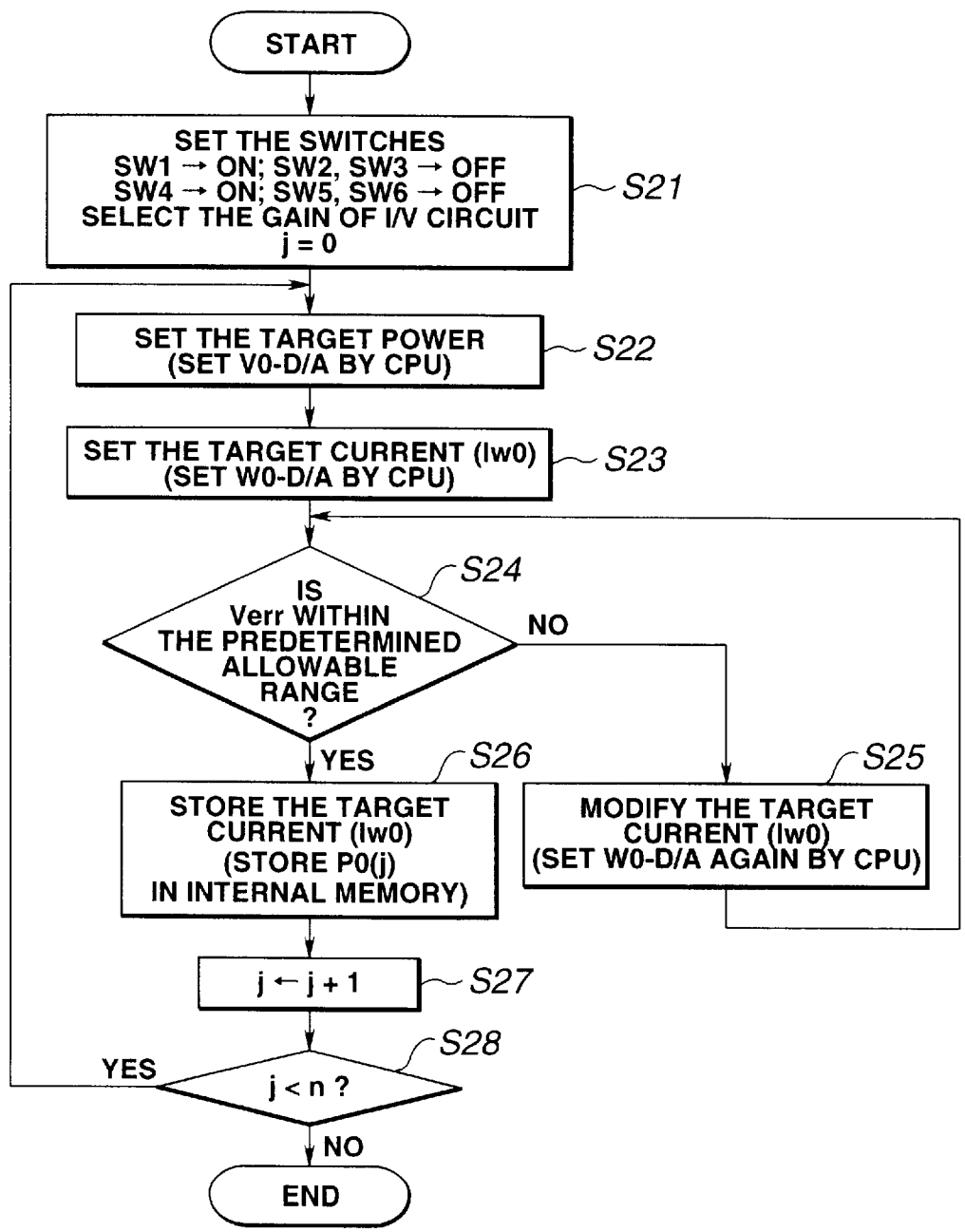

In step S21 in the flow chart of FIG. 5, the CPU 4 sets the switches SW1, SW2, and SW3 so that the SW1 is connected (turned on) to the V0-D/A converter 6, and the switches SW2 and SW3 are connected to ground. The CPU 4 also turns on the switch SW4 and turns off the switches SW5 and SW6. Furthermore, the CPU 4 sets the current-to-voltage conversion gain (transimpedance) of the current-to-voltage conversion circuit 3 to a write-mode gain. Before the above setting operation, the output currents Iw0, Iw1, and Iw2 of the W0-constant current circuit 15, W1-constant current circuit 16, and W2-constant current circuit 17 are all maintained at 0 [mA], and the output current Ir of the R-constance current circuit 14 is set to a value which causes the laser diode 1 to have a bias current corresponding to its threshold current. The CPU 4 also sets the parameter j to 0.

In step S22, the CPU 4 refers to the write power setting table stored in the memory (not shown) provided inside or outside the CPU 4 so as to detect the optimum write power (hereafter referred to as the target write power P0'(j) where j denotes the zone number from 0 to n) depending on the type of an inserted disk and the temperature inside the drive. The CPU 4 sets the V0-D/A converter 6 so that its output corresponds to the target write power P0'(j). Then in step S23, the CPU 4 sets the W0-D/A converter 11 so that the W0-constant current circuit 15 can provide a proper output current in accordance with the output of the W0-D/A converter 11. The initial setting value of the W0-D/A converter 11 is selected so that the read power does not exceed the target write power P0'(j) even when the write power control loop gain becomes maximum as a result of variations in parameters such as the gain of the laser diode driving circuit, the current-to-light conversion efficiency of the laser diode, the light-to-current conversion efficiency of the photo detector, the gain of the current-to-voltage conversion circuit, and the gain of the operational amplifier.

In step S24, the CPU 4 checks the output of the operational amplifier 5 via the A/D converter 9 and judges whether the output of the A/D converter 9 is within a predetermined allowable bit range. If no, then the process goes to step S25 in which the CPU 4 corrects the setting associated with the W0-D/A converter 11 so that the above output falls within the allowable range. Then the process returns to step S24.

In the specific embodiment shown in FIG. 1, $$R1=R2 \text{ and } R3=R4=R5=R6$$

thus the output (Verr) of the operational amplifier 5 is given by $$Verr=-Vin+(V0+V1+V2)+(Vref/2).$$

Since V1 and V2 are both equal to zero in the above equation, the setting of the W0-D/A converter 11 may be corrected so that the Vin becomes V0, that is, the output of the operational amplifier 5 becomes equal to Vref/2.

If it is concluded in step S24 that the output of the A/D converter 9 falls within the allowable bit range, the process goes to step S26 in which the CPU 4 stops checking the output of the A/D converter 9 and stores the setting value associated with the W0-D/A converter 11 as the optimum write power P0(j) for the zone j into the memory (not shown) provided inside or outside the CPU 4. Then in step S27, j is incremented by 1. In step S28, the CPU 4 judges whether j is smaller than n. If j is smaller than n then the process returns to step S22 so as to repeat steps S22 to S28. If it is concluded in step S28 that j is equal to or greater than n, the test light emitting operation for setting the write power is completed.

In this way, the optimum write power levels P0(0), . . . , P0(n) for the respective zones, that is, the output currents Iw0 for the respective zones, are set.

(2) Setting of the output current Iw1 of the W1-constant current circuit 16

Figure 6:
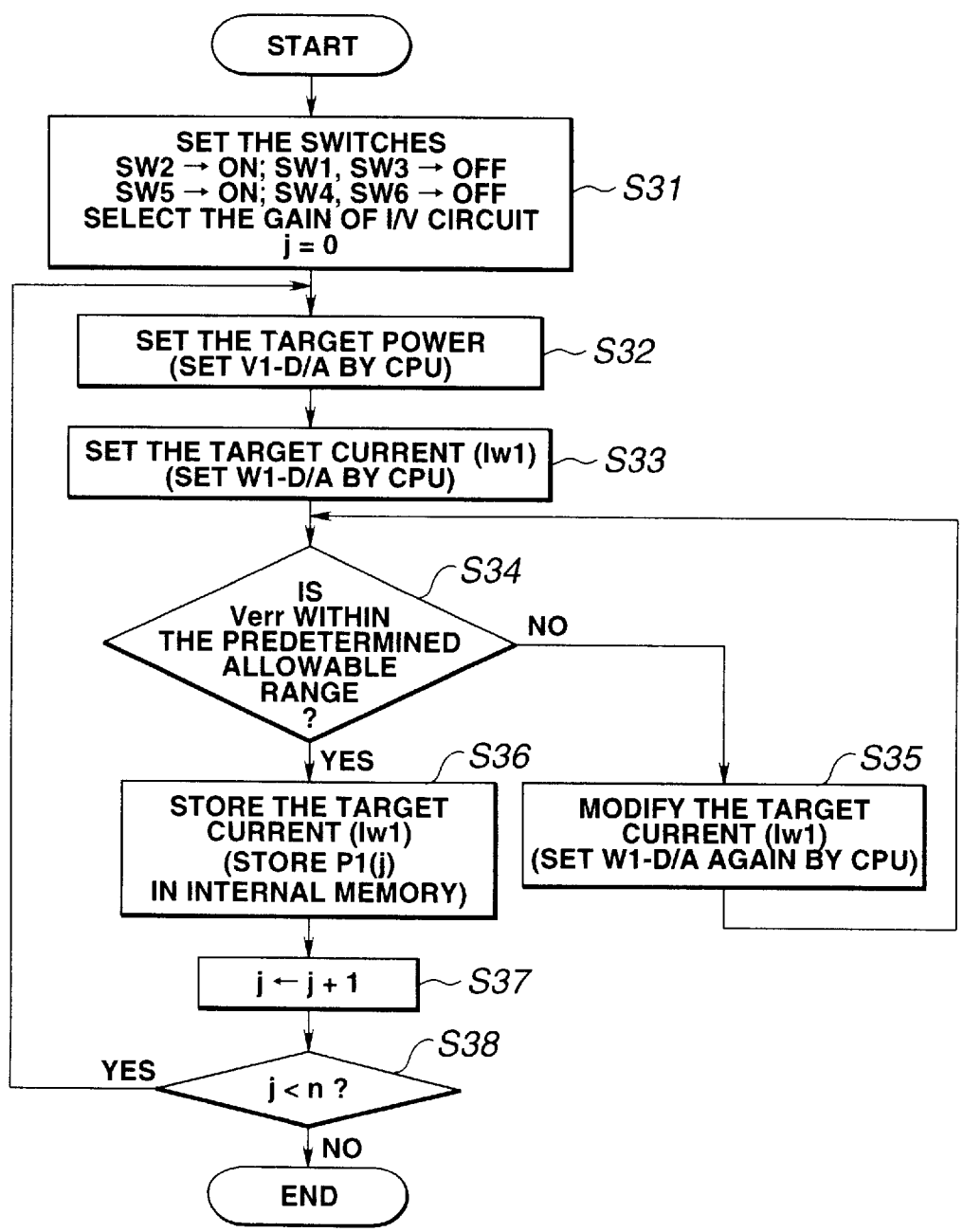

In step S31 in the flow chart of FIG. 6, the CPU 4 sets the switches SW1–SW3 so that SW2 is connected (turned on) to the V1-D/A converter 7, and SW1 and SW3 are connected to ground. The CPU 4 also turns on the switch SW5 and turns off the switches SW4 and SW6. Before the above setting operation, the output currents Iw0, Iw1, and Iw2 of the W0-constant current circuit 15, W1-constant current circuit 16, and W2- constant current circuit 17 are all maintained at 0 [mA], and the output current Ir of the R-constance current circuit 14 is set to a value which causes the laser diode 1 to have a bias current corresponding to its threshold current. The CPU 4 also sets the parameter j to 0.

In step S32, the CPU 4 refers to the write power setting table stored in the memory (not shown) provided inside or outside the CPU 4 so as to detect the optimum write power (hereafter referred to as the target write power P1'(j) where j denotes the zone number from 0 to n) depending on the type of an inserted disk, the temperature inside the drive, and the recording area (for example zone) j. The CPU 4 sets the V1-D/A converter 7 so that its output corresponds to the target write power P1'(j). Then in step S33, the CPU 4 sets the W1-D/A converter 12 so that the W1-constant current circuit 16 can provide a proper output current in accordance with the output of the W1-D/A converter 12. The initial setting value of the W1-D/A converter 12 is selected either to the target write power P0'(j) given to the W0-D/A converter 11 or to an optimum write power P0(j) calculated from the above target write power P0'(j). It is assumed here that the laser diode driving circuit gain is the same for Iw0 and Iw1 (W0-D/A converter 11→Iw0, W1-D/A converter 12→Iw1). In step S34, the CPU 4 checks the output of the operational amplifier 5 via the A/D converter 9 and judges whether the output of the A/D converter 9 is within a predetermined allowable bit range. If no, then the process goes to step S35 in which the CPU 4 corrects the setting associated with the W1-D/A converter 12 so that the above output falls within the allowable range. Then the process returns to step S34.

In the specific embodiment shown in FIG. 1,

R1=R2 and R3=R4=R5=R6 thus the output (Verr) of the operational amplifier 5 is given by

Verr=−Vin+(V0+V1+V2)+(Vref/2).

Since V0 and V2 are both equal to zero in the above equation, the setting of the W1-D/A converter 12 may be corrected so that the Vin becomes equal to V1, that is, the output of the operational amplifier 5 becomes equal to Vref/2.

If it is concluded in step S34 that the output of the A/D converter 9 falls within the allowable bit range, the process goes to step S36 in which the CPU 4 stops checking the output of the A/D converter 9 and stores the setting value associated with the W1-D/A converter 12, as the optimum write power P1(j) for the output current Iw1 in the zone j, into the memory (not shown) provided inside or outside the CPU 4. Then in step S37, j is incremented by 1. In step S38, the CPU 4 judges whether j is smaller than n. If j is smaller than n then the process returns to step S32 so as to repeat steps S32–S38. If it is concluded in step S38 that j is equal to or greater than n, the test light emitting operation for setting the write power is completed. In this way, the optimum write power levels P1(0), . . . , P1(n) for the respective zones, that is, the output currents Iw1 for the respective zones, are set.

(3) Setting of the output current Iw2 of the W2-constant current circuit 17

Figure 7:
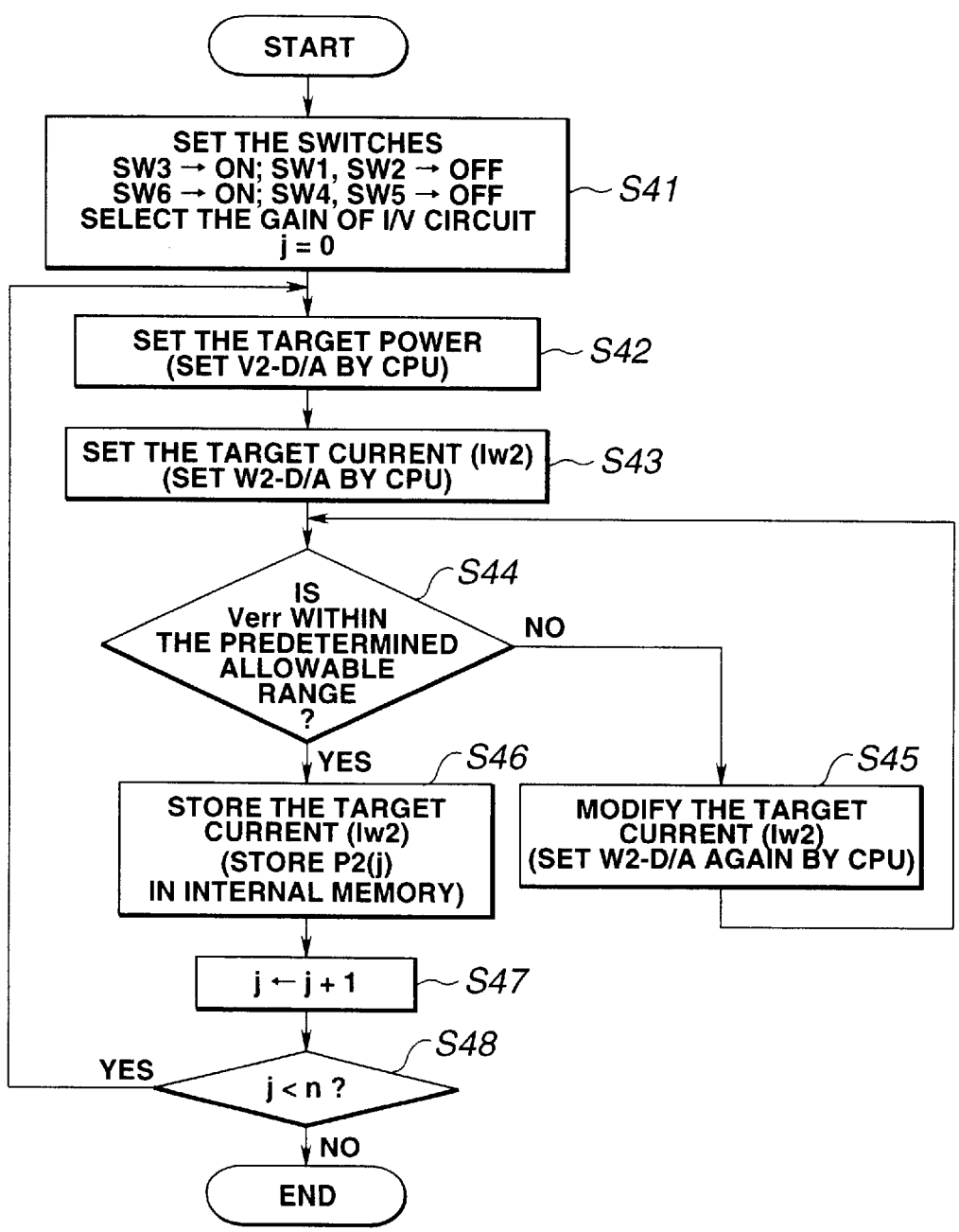

Referring to FIG. 7, in step S41, the CPU 4 sets the switches SW1–SW3 so that SW3 is connected (turned on) to the V2-D/A converter 8, and SW1 and SW2 are connected to ground. The CPU 4 also turns on the switch SW6 and turns off the switches SW4 and SW5. Before the above setting operation, the output currents Iw0, Iw1, and Iw2 of the W0-constant current circuit 15, W1-constant current circuit 16, and W2-constant current circuit 17 are all maintained at 0 [mA], and the output current Ir of the R-constance current circuit 14 is set to a value which causes the laser diode 1 to have a bias current corresponding to its threshold current. The CPU 4 also sets the parameter j to 0. In step S42, the CPU 4 refers to the write power setting table stored in the memory (not shown) provided inside or outside the CPU 4 so as to detect the optimum write power (hereafter referred to as the target write power P2'(j) where j denotes the zone number from 0 to n) depending on the type of an inserted disk, the temperature inside the drive, and the recording area (for example zone) j. The CPU 4 sets the V2-D/A converter 8 so that its output corresponds to the target write power P1'(j).

Then in step S43, the CPU 4 sets the W2-D/A converter 13 so that the W2-constant current circuit 17 can provide the specified output current. The initial setting value of the W2-D/A converter 13 is selected either to the target write power P1'(j) given to the W1-D/A converter 12 or to an optimum write power P1(j) calculated from the above target write power P1'(j). It is assumed here that the laser diode driving circuit gain is the same for Iw1 and Iw2 (W1-D/A converter 12→Iw0, W2-D/A converter 13→Iw2 ). In step S44, the CPU 4 checks the output of the operational amplifier 5 via the A/D converter 9 and judges whether the output of the A/D converter 9 is within a predetermined allowable bit range. If no, then the process goes to step S45 in which the CPU 4 corrects the setting associated with the W2-D/A converter 13 so that the above output falls within the allowable range. Then the process returns to step S44.

In the specific embodiment shown in FIG. 1,

R1=R2 and R3=R4=R5=R6 thus the output (Verr) of the operational amplifier 5 is given by

Verr=−Vin+(V0+V1+V2)+(Vref/2).

Since V0 and V1 are both equal to zero in the above equation, the setting of the W2-D/A converter 13 may be corrected so that the Vin becomes equal to V2, that is, the output of the operational amplifier 5 becomes equal to Vref/2.

If it is concluded in step S44 that the output of the A/D converter 9 falls within the allowable bit range, the process goes to step S46 in which the CPU 4 stops checking the output of the A/D converter 9 and stores the setting value associated with the W2-D/A converter 13, as the optimum write power P2(j) for the output current Iw2 in the zone j, into the memory (not shown) provided inside or outside the CPU 4. Then in step S47, j is incremented by 1. In step S48, the CPU 4 judges whether j is smaller than n. If j is smaller than n then the process returns to step S42 so as to repeat steps S42–S48. If it is concluded in step S48 that j is equal to or greater than n, the test light emitting operation for setting the write power is completed.

In this way, the optimum write power levels P2(0), . . . , P2(n) for the respective zones, that is, the output currents Iw2 for the respective zones, are set.

When the erase power is equal to the write power (for example P1(j) or P2(j), the setting for the erase power may be performed using the same setting values as those for the write power. Also in the case where the target value of the erase power is different from that of the write power, the setting for the erase power may be performed by means of calculation based on the optimum write power level and the current-to-light conversion efficiency of the laser diode, or may be performed in the same manner as in the setting for the write power.

Although in this specific embodiment the switches SW1, SW2, and SW3 are employed, the above operation may also be performed without using these switches. In this case, the outputs of the corresponding D/A converters are set to zero instead of grounding them via the switches.

(Advantages)

In this embodiment, as described above, the power setting is performed not in the ALPC areas of an optical recording medium but in the test zones or manufacturer zones provided across 100 or more tracks in non-user areas located in an inner or outer portion of the disk. This allows the semiconductor laser to be driven by a multilevel semiconductor laser driving current with a simple low-frequency-band circuit.

Furthermore, the semiconductor laser control circuit for the multilevel laser driving circuit can be realized using a single low-speed laser diode monitor without having to use three high-speed APC circuits. This allows a reduction in the cost of the semiconductor laser control circuit.

The plurality of laser diode driver circuit stages have the same gain so that the output power level may be easily set using the optimized semiconductor laser output setting values which have been already determined thereby ensuring that power level setting can be performed easily in test light emission. This also allows a reduction in time required to perform test light emission for setting the power levels.

Second Embodiment:

This second embodiment is similar to the first embodiment described above with some exceptions, and thus like parts are denoted by like reference numerals and these similar parts are not described herein in further detail.

(Construction)

Figure 8:
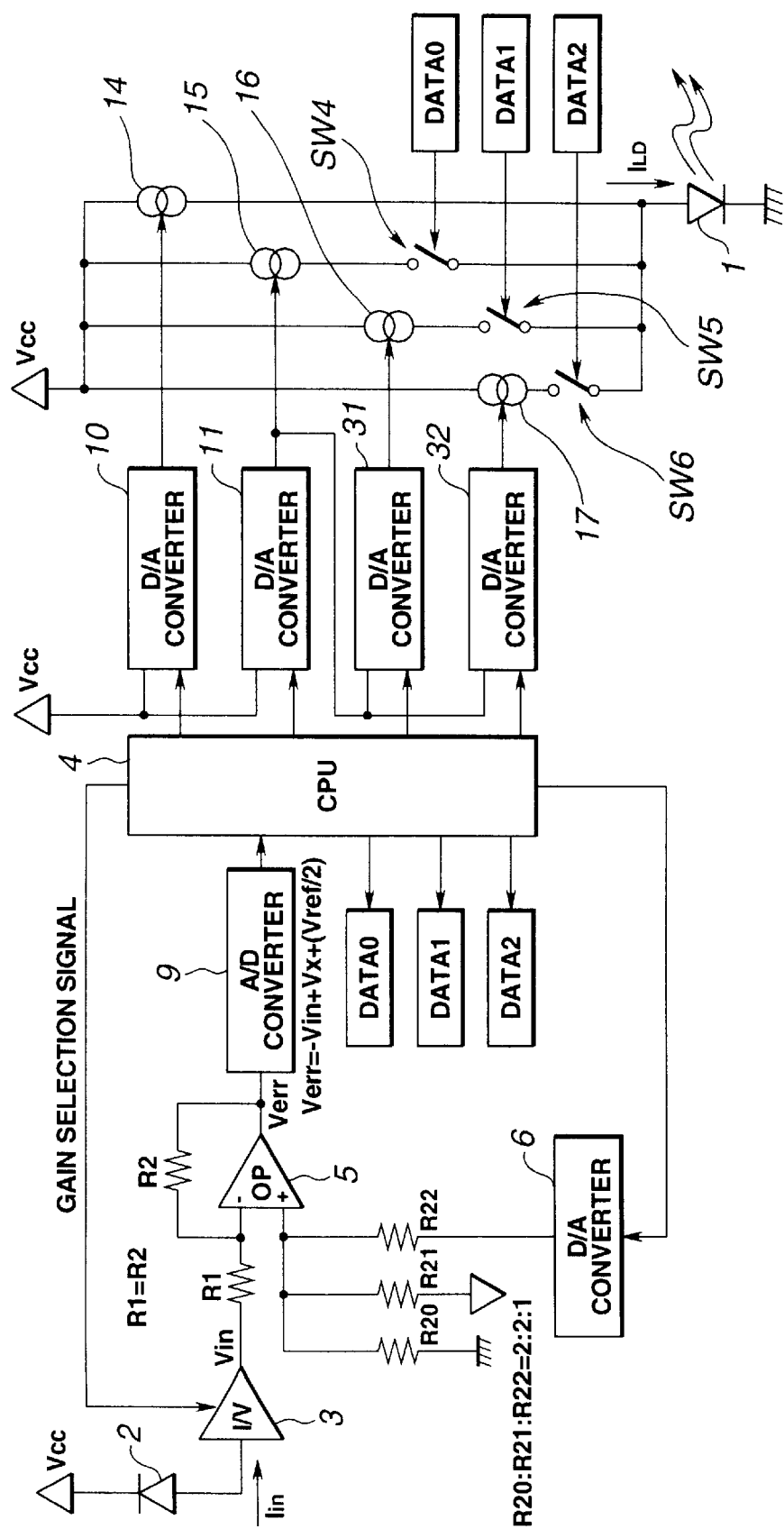
FIG. 8 is a circuit diagram illustrating the construction of a second embodiment of a semiconductor laser control circuit according to the present invention.

In the first embodiment, the V0-D/A converter 6, V1-D/A converter 7, V2-D/A converter 8, and the switches SW1, SW2, and SW3 are used to set the target read power Pr' and the target write power P0'(j), P1'(j), and P2'(j). In this second embodiment, the target read power Pr' and the target write power P0'(j), P1'(j), and P2'(j) are set using a single digital-to-analog (D/A) converter 41 for specifying the output optical power level, as shown in FIG. 8. In this second embodiment, thus, the positive input terminal of an operational amplifier 5 is connected to ground via a resistor 20, to a reference voltage (Vref) via a resistor R21, and to a Vx-D/A converter 41 via a resistor R22. The output level of the Vx-D/A converter 41 is specified by a CPU 4. The respective resistors used herein have resistance values satisfying the following conditions:

R1=R2 and R20:R21:R22=2:2:1.

The other parts are constructed in the same manner as in the first embodiment.

(Operation)

In this second embodiment, the specified output value of the Vx-D/A converter 41 is denoted by Vx. The values of resistors are selected such that R1=R2 and R20:R21:R22=2:2:1.

Therefore, the output (Verr) of the operational amplifier 5 is given by

Verr=−Vin+Vx+(Vref/2).

Therefore, the output levels of the R-D/A converter 10, W0-D/A converter 11, W1-D/A converter 12, and W2-D/A converter 13 are adjusted so that the output of the operational amplifier 5 becomes equal to Vref/2.

That is, setting of the optimum read power Pr(j) is performed as follows. In step S1, as in the first embodiment described above with reference to FIG. 3, the switches SW4, SW5, and SW6 are turned off (into open states) and the current-to-voltage conversion gain (transimpedance) of the current-to-voltage conversion circuit 3 is set to a read-mode gain. Before the above setting operation, the output currents Ir, Iw0, Iw1, and Iw2 of the R-constant current circuit 14, W0-constant current circuit 15, W1-constant current circuit 16, W2-constant current circuit 17 are all maintained at 0 [mA].

In step S2, the CPU 4 refers to the read power setting table stored in the memory (not shown) provided inside or outside the CPU 4 so as to detect the optimum read power (hereafter referred to as the target read power Pr') depending on the type of an inserted disk and the temperature inside the drive. The CPU 4 then sets the Vx-D/A converter 41 so that it provides an output Vx corresponding to the target read power Pr'.

Then in step S3, the CPU 4 sets the R-D/A converter 10 so that the R-constant current circuit 14 can provide a proper output current in accordance with the output of the R-D/A converter 10. The initial setting value of the R-D/A converter 10 is selected so that the read power does not exceed the target read power Pr' even when the read power control loop gain becomes maximum as a result of variations in parameters such as the gain of the laser diode driving circuit, the current-to-light conversion efficiency of the laser diode, the light-to-current conversion efficiency of the photo detector, the gain of the current-to-voltage conversion circuit 3, and the gain of the operational amplifier 5.

In step S4, the CPU 4 checks the output of the operational amplifier 5 via the A/D converter 9 and judges whether the output of the A/D converter 9 is within the predetermined allowable bit range. If no then the process goes to step S5 so as to correct the setting of the R-D/A converter 10 in the above-described manner.

Setting of the optimum write power P0(j) is performed as follows. In step S21, as in the first embodiment described above with reference to FIG. 5, the CPU 4 turns on the switch SW4 and turns off the switches SW5 and SW6. Furthermore, the CPU 4 sets the current-to-voltage conversion gain (transimpedance) of the current-to-voltage conversion circuit 3 to a write-mode gain. Before the above setting operation, the output currents Iw0, Iw1, and Iw2 of the W0-constant current circuit 15, W1-constant current circuit 16, and W2-constant current circuit 17 are all maintained at 0 [mA], and the output current Ir of the R-constance current circuit 14 is set to a value which causes the laser diode 1 to have a bias current corresponding to its threshold current. The CPU 4 also sets the parameter j to 0.

Then in step S22, the CPU 4 refers to the write power setting table stored in the memory (not shown) provided inside or outside the CPU 4 so as to detect the optimum write power (hereafter referred to as the target write power P0'(j) where j denotes the zone number from 0 to n) depending on the type of an inserted disk, the temperature inside the drive, and the recording area (for example zone). The CPU 4 sets the Vx-D/A converter 41 so that it provides an output Vx(j) corresponding to the target write power P0'(j).

Then in step S23, the CPU 4 sets the W0-D/A converter 11 so that the W0-constant current circuit 15 can provide a proper output current in accordance with the output of the W0-D/A converter 11. The initial setting value of the W0-D/A converter 11 is selected so that the read power does not exceed the target write power P0'(j) even when the write power control loop gain becomes maximum as a result of variations in parameters such as the gain of the laser diode driving circuit, the current-to-light conversion efficiency of the laser diode, the light-to-current conversion efficiency of the photo detector.

In step S24, the CPU 4 checks the output of the operational amplifier 5 via the A/D converter 9 and judges whether the output of the A/D converter 9 is within a predetermined allowable bit range. If no, then the process goes to step S25 in which the CPU 4 corrects the setting associated with the W0-D/A converter 11 so that the above output falls within the allowable range.

Setting of the optimum write power P1(j) is performed as follows. In step S31, as in the first embodiment described above with reference to FIG. 6, the CPU 4 turns on the switch SW5 and turns off the switches SW4 and SW6. Before the above setting operation, the output currents Iw0, Iw1, and Iw2 of the W0-constant current circuit 15, W1-constant current circuit 16, and W2-constant current circuit 17 are all maintained at 0 [mA], and the output current Ir of the R-constance current circuit 14 is set to a value which causes the laser diode 1 to have a bias current corresponding to its threshold current. The CPU 4 also sets the parameter j to 0.

In step S32, the CPU 4 refers to the write power setting table stored in the memory (not shown) provided inside or outside the CPU 4 so as to detect the optimum write power (hereafter referred to as the target write power P1'(j) where j denotes the zone number from 0 to n) depending on the type of an inserted disk, the temperature inside the drive, and the recording area (for example zone) J. The CPU 4 then sets the Vx-D/A converter 41 so that it provides an output Vx(j) corresponding to the target read power P1'(j).

Then in step S33, the CPU 4 sets the W1-D/A converter 12 so that the W1-constant current circuit 16 can provide a proper output current in accordance with the output of the W1-D/A converter 12. The initial setting value of the W1-D/A converter 12 is selected either to the target write power P0'(j) given to the W0-D/A converter 11 or to an optimum write power P0(j) calculated from the above target write power P0'(j). It is assumed here that the laser diode driving circuit gain is the same for Iw0 and Iw1 (W0-D/A converter 11→Iw0, W1-D/A converter 12→Iw1).

In step S34, the CPU 4 checks the output of the operational amplifier 5 via the A/D converter 9 and judges whether the output of the A/D converter 9 is within a predetermined allowable bit range. If no, then the process goes to step S35 in which the CPU 4 corrects the setting associated with the W1-D/A converter 12 so that the above output falls within the allowable range.

Setting of the optimum write power P2(j) is performed as follows. In step S41, as in the first embodiment described above with reference to FIG. 7, the CPU 4 turns on the switch SW6 and turns off the switches SW4 and SW5. Before the above setting operation, the output currents Iw0, Iw1, and Iw2 of the W0-constant current circuit 15, W1-constant current circuit 16, and W2-constant current circuit 17 are all maintained at 0 [mA], and the output current Ir of the R-constance current circuit 14 is set to a value which causes the laser diode 1 to have a bias current corresponding to its threshold current. The CPU 4 also sets the parameter j to 0.

Then in step S42, the CPU 4 refers to the write power setting table stored in the memory (not shown) provided inside or outside the CPU 4 so as to detect the optimum write power (hereafter referred to as the target write power P2'(j) where j denotes the zone number from 0 to n) depending on the type of an inserted disk, the temperature inside the drive, and the recording area (for example zone) j. The CPU 4 then sets the Vx-D/A converter 41 so that it provides an output Vx(j) corresponding to the target read power P2'(j).

Then in step S43, the CPU 4 sets the W2-D/A converter 13 so that the W2-constant current circuit 17 can provide the specified output current. The initial setting value of the W2-D/A converter 13 is selected either to the target write power P1'(j) given to the W1-D/A converter 12 or to an optimum write power P1(J) calculated from the above target write power P1'(j). It is assumed here that the laser diode driving circuit gain is the same for Iw1 and Iw2 (W1-D/A converter 12→Iw0, W2-D/A converter 13→Iw2 ).

In step S44, the CPU 4 checks the output of the operational amplifier 5 via the A/D converter 9 and judges whether the output of the A/D converter 9 is within a predetermined allowable bit range. If no, then the process goes to step S45 in which the CPU 4 corrects the setting associated with the W2-D/A converter 13 so that the above output falls within the allowable range.

In other respects, the operation is performed in the same manner as in the first embodiment described above.

(Advantages)

In addition to the advantages provided by the first embodiment described above, the second embodiment provides an additional advantage that only a single digital-to-analog converter (Vx-D/A converter) 41 is needed as a converter for specifying the optical output power by which all the target read power Pr', the target write power P0'(j), P1'(j), and P2'(j) can be set. This allows further simplification in the circuit configuration and thus further reduction in cost.

Third Embodiment:

This third embodiment is also similar to the first embodiment described above with some exceptions, and thus like parts are denoted by like reference numerals and these similar parts are not described herein in further detail.

(Construction)

Figure 9:
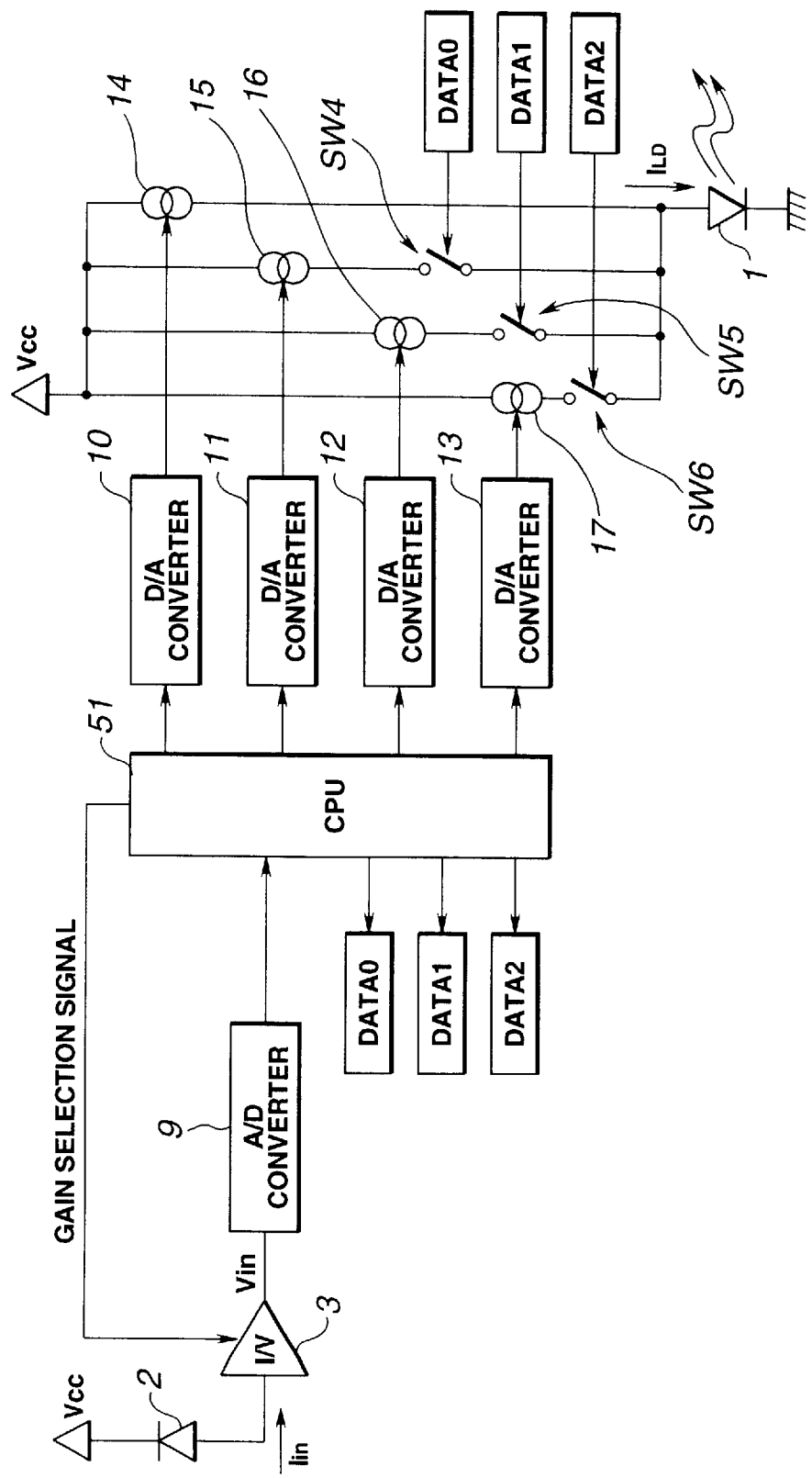
FIG. 9 is a circuit diagram illustrating the construction of a third embodiment of a semiconductor laser control circuit according to the present invention.

In the first embodiment, the V0-D/A converter 6, V1-D/A converter 7, V2-D/A converter 8, and the switches SW1, SW2, and SW3 are used to set the target read power Pr' and the target write power P0'(j), P1'(j), and P2'(j). Furthermore, in the first embodiment, the output Verr of the operational amplifier 5 is checked via the A/D converter 9 and the setting associated with the R-D/A converter 10, W0-D/A converter 11, W1-D/A converter 12, and W2-D/A converter 13 are corrected so that the output of the A/D converter 9 falls within the predetermined allowable range. Instead, in this third embodiment, as shown in FIG. 9, the output of the current-to-voltage converter 3 is directly applied to the A/D converter 9 without using the operational amplifier 5, the V0-D/A converter 6, the V2-D/A converter 7, the V2-D/A converter 8, the switches SW1, SW2, and Sw3. The digital signal generated by the A/D converter 9 is then applied to the CPU 51. Thus, in this third embodiment, the CPU 51 directly reads the optical output power and corrects the setting of the R-D/A converter 10, the W0-D/A converter 11, the W1-D/A converter 12, and the W2-D/A converter 13. The other parts are constructed in the same manner as in the first embodiment.

(Operation)

In read-mode operation, the switches SW4, SW5, and SW6 are turned off (into open states) and the gain of the current-to-voltage circuit 3 is set to a read-mode gain. The CPU 51 determines the target power to be achieved, and sets the R-D/A converter 10 so that the constant current circuit can provide a proper current corresponding to the target power. In the above setting, the output of the R-D/A converter 10 is set to a value which has been determined and stored (learned) in the CPU 51 during a test light emitting operation performed in advance, as will be described later. The light emission in the read mode is performed in accordance with the above conditions. In the read light emitting operation, the CPU periodically checks the output of the A/D converter 9 and corrects the setting of the R-D/A converter 10 so that the output of the A/D converter 9 becomes equal to a predetermined target value or so that the difference between the output of the A/D converter 9 and the predetermined target value falls within a predetermined allowable range. In this operation, the output of the R-D/A converter specifying the output current may be corrected each time the output of the A/D converter 9 is checked at the predetermined constant time intervals or may also be corrected to an optimum value determined by the CPU 51 by means of averaging a plurality of output values of the A/D converter 9.

In the write/erase mode, the output currents Iw0, Iw1, and Iw2 are set separately, as for the read mode, to values which have been determined by a test light emitting operation performed in advance as will be described later so that the optical output power is set by the CPU 51 to an optimum value for each recording area (zone) (in accordance with the outputs of the W0-D/A converter 11, W1-D/A converter 12, and W2-D/A converter 13. In this specific embodiment, it is assumed that the output currents are set such that Iw0≦Iw1≦Iw2.

In the erase-mode operation, the CPU 51 sets the W0-D/A converter 11, W1-D/A converter 12, and the W2-D/A converter 13 so that the corresponding constant current circuits can provide specified currents. The CPU 4 turns on the switches SW4 and SW5 in response to the erase gate.

Although in this specific embodiment the W0-constant current circuit 15 and the W1-constant current circuit 16 are employed as the erase current supplying circuits, other combinations of constant current circuits for example either the W0-constant current circuit 15 and the W2-constant current circuit 17 or all the W0-constant current circuit 15, the W1-constant current circuit, and the W2-constant current circuit 17 may also be employed. In any case, the R-constant current circuit 14 is used to supply a bias current (threshold current) to the laser diode.

In the write-mode operation, the CPU 51 sets the W0-D/A converter 11, W1-D/A converter 12, and the W2-D/A converter 13 so that the W0-constant current circuit 15, the W1-constant current circuit, and the W2-constant current circuit 17 provide specified currents.

The CPU 51 turns on and off the switches SW4, SW5, and SW6 in response to the write data thereby supplying driving current to the laser diode 1 as shown in FIG. 2.

The test light emitting operation is performed in predetermined test zones or manufacturer zones disposed in non-user areas in an inner or outer disk portion.

The test light emitting operation for setting the read power will be described in greater detail below.

The CPU 51 turns off the switches SW4, SW5, and SW6 and sets the current-to-voltage conversion gain (transimpedance) of the current-to-voltage conversion circuit 3 to a read-mode gain. Before the above setting operation, the output currents Ir, Iw0, Iw1, and Iw2 of the R-constant current circuit 14, W0-constant current circuit 15, W1-constant current circuit 16, W2-constant current circuit 17 are all maintained at 0 [mA]. Then the CPU 51 refers to the read power setting table stored in a memory (not shown) provided inside or outside the CPU 51 so as to detect the optimum read power (hereafter referred to as the target read power Pr') depending on the type of an inserted disk and the temperature inside the drive.

The CPU 51 sets the R-D/A converter 10 so that the R-constant current circuit 14 provides a proper output current in accordance with the output of the R-D/A converter 10.

The initial setting value of the R-D/A converter 10 is selected so that the read power does not exceed the target read power Pr' even when the read power control loop gain becomes maximum as a result of variations of parameters such as the gain of the laser diode driving circuit, the current-to-light conversion efficiency of the laser diode, the light-to-current conversion efficiency of the photo detector, the gain of the current-to-voltage conversion circuit 3, and the gain of the operational amplifier 5.

The CPU 51 checks the output of the A/D converter 9 and corrects the setting of the R-D/A converter 10 so that the output of the A/D converter 9 becomes equal to the target read power Pr' or so that the difference between the output of the A/D converter 9 and the predetermined target value falls within a predetermined allowable range.

When the difference between the output of the A/D converter 9 and the target read power Pr' falls within the predetermined allowable range, the CPU 51 stops checking the output of the A/D converter 9. The CPU 51 stores the setting value associated with the R-D/A converter 10 as the optimum read power Pr in the reading operation into the memory (not shown) provided inside or outside the CPU 51. Thus, the test light emitting operation for setting the read power is completed.

The test light emitting operation for setting write power is performed by successively setting the output currents Iw0, Iw1, and Iw2 of the W1-constant current circuit 15, W1-constant current circuit 16, and W2-constant current circuit 17 as described in detail below.

(1) Setting of the output current Iw0 of the W0-constant current circuit 15

As shown in FIG. 9, the CPU 51 turns on the switch SW4 and turns off the switches SW5 and SW6. Furthermore, the CPU 51 sets the current-to-voltage conversion gain (transimpedance) of the current-to-voltage conversion circuit 3 to a write-mode gain. Before the above setting operation, the output currents Iw0, Iw1, and Iw2 of the W0-constant current circuit 15, W1-constant current circuit 16, and W2-constant current circuit 17 are all maintained at 0 [mA], and the output current Ir of the R-constance current circuit 14 is set to a value which causes the laser diode 1 to have a bias current corresponding to its threshold current. The CPU 51 also sets the parameter j to 0.

The CPU 51 refers to the write power setting table stored in the memory (not shown) provided inside or outside the CPU 51 so as to detect the optimum write power (hereafter referred to as the target write power P0'(j) where j denotes the zone number from 0 to n) depending on the type of an inserted disk, the temperature inside the drive, and the recording area (for example zone).

Then the CPU 51 sets the W0-D/A converter 11 so that the W0-constant current circuit 15 can provide a proper output current in accordance with the output of the W0-D/A converter 11. The initial setting value of the R-D/A converter 11 is selected so that the read power does not exceed the target write power P0'(J) even when the write power control loop gain becomes maximum as a result of variations in parameters such as the gain of the laser diode driving circuit, the current-to-light conversion efficiency of the laser diode, the light-to-current conversion efficiency of the photo detector, The CPU 51 checks the output of the operational amplifier 5 via the A/D converter 9 and corrects the setting associated with the W0-D/A converter 11 so that the output of the A/D converter 9 becomes equal to the predetermined target write power P0'(j) or the difference between the output of the A/D converter 9 and the target write power P0'(j) falls within a predetermined allowable range.

When the difference between the output of the A/D converter 9 and the target read power P0(j) falls within the predetermined allowable range, the CPU 51 stops checking the output of the A/D converter 9. The CPU 51 stores the setting value associated with the W0-D/A converter 11 as the optimum read power P0(j) in the reading operation into the memory (not shown) provided inside or outside the CPU 51. Then the CPU 15 increments j by 1, and judges whether j is smaller than n. If yes then the above process is performed repeatedly until the optimum write power levels have been calculated for all zones. If j is equal to or greater than n, the test light emitting operation for setting the optimum write power is completed.

In this way, the optimum write power levels P0(0), . . . , P0(n) for the respective zones, that is, the output currents Iw0 for the respective zones, are set.

(2) Setting of the output current Iw1 of the W1-constant current circuit 16

As shown in FIG. 9, the CPU 51 turns of the switch SW5 and turns off the switches SW4 and SW6. Furthermore, the CPU 51 sets the current-to-voltage conversion gain (transimpedance) of the current-to-voltage conversion circuit 3 to a write-mode gain. Before the above setting operation, the output currents Iw0, Iw1, and Iw2 of the W0-constant current circuit 15, W1-constant current circuit 16, and W2-constant current circuit 17 are all maintained at 0 [mA], and the output current Ir of the R-constance current circuit 14 is set to a value which causes the laser diode 1 to have a bias current corresponding to its threshold current. The CPU 4 also sets the parameter j to 0.

The CPU 51 refers to the write power setting table stored in the memory (not shown) provided inside or outside the CPU 51 so as to detect the optimum write power (hereafter referred to as the target write power P1'(j) where j denotes the zone number from 0 to n) depending on the type of an inserted disk, the temperature inside the drive, and the recording area (for example zone). Then the CPU 51 sets the W1-D/A converter 12 so that the W1-constant current circuit 16 can provide a proper output current in accordance with the output of the W1-D/A converter 12. The initial setting value of the W1-D/A converter 12 is selected either to the target write power P0'(j) given to the W0-D/A converter 11 or to an optimum write power P0(j) calculated from the above target write power P0'(j). It is assumed here that the write power control loop gain is the same for Iw0 and Iw1.

The CPU 51 checks the output of the operational amplifier 5 via the A/D converter 9 and corrects the setting associated with the W1-D/A converter 12 so that the output of the A/D converter 9 becomes equal to the predetermined target write power P1'(j) or the difference between the output of the A/D converter 9 and the target write power P1'(j) falls within a predetermined allowable range.

When the difference between the output of the A/D converter 9 and the target read power P1'(j) falls within the predetermined allowable range, the CPU 51 stops checking the output of the A/D converter 9. The CPU 51 stores the setting value associated with the W1-D/A converter 12 as the optimum read power P1(j) in the reading operation into the memory (not shown) provided inside or outside the CPU 51. Then the CPU 15 increments j by 1, and judges whether j is smaller than n. If yes then the above process is performed repeatedly until the optimum write power levels have been calculated for all zones. If j is equal to or greater than n, the test light emitting operation for setting the optimum write power is completed.

In this way, the optimum write power levels P1(0), . . . , P1(n) for the respective zones, that is, the output currents Iw1 for the respective zones, are set.

(3) Setting of the output current Iw2 of the W2-constant current circuit 17

As shown in FIG. 9, the CPU 51 turns of the switch SW6 and turns off the switches SW4 and SW5. Furthermore, the CPU 51 sets the current-to-voltage conversion gain (transimpedance) of the current-to-voltage conversion circuit 3 to a write-mode gain. Before the above setting operation, the output currents Iw0, Iw1, and Iw2 of the W0-constant current circuit 15, W1-constant current circuit 16, and W2-constant current circuit 17 are all maintained at 0 [mA], and the output current Ir of the R-constance current circuit 14 is set to a value which causes the laser diode 1 to have a bias current corresponding to its threshold current. The CPU 51 also sets the parameter j to 0.

Then the CPU 51 refers to the write power setting table stored in the memory (not shown) provided inside or outside the CPU 51 so as to detect the optimum write power (hereafter referred to as the target write power P2'(j) where j denotes the zone number from 0 to n) depending on the type of an inserted disk, the temperature inside the drive, and the recording area (for example zone). Then the CPU 51 sets the W2-D/A converter 13 so that the W2-constant current circuit 17 can provide a proper output current in accordance with the output of the W2-D/A converter 13. The initial setting value of the W2-D/A converter 13 is selected either to the target write power P1'(j) given to the W1-D/A converter 12 or to an optimum write power P1(j) calculated from the above target write power P1'(j). It is assumed here that the write power control loop gain is the same for Iw1 and Iw2.

The CPU 51 checks the output of the operational amplifier 5 via the A/D converter 9 and corrects the setting associated with the W2-D/A converter 13 so that the output of the A/D converter 9 becomes equal to the predetermined target write power P2'(j) or the difference between the output of the A/D converter 9 and the target write power P2'(j) falls within a predetermined allowable range.

When the difference between the output of the A/D converter 9 and the target read power P2'(j) falls within the predetermined allowable range, the CPU 51 stops checking the output of the A/D converter 9. The CPU 51 stores the setting value associated with the W2-D/A converter 13 as the optimum read power P2(j) in the reading operation into the memory (not shown) provided inside or outside the CPU 51. Then the CPU 15 increments j by 1, and judges whether j is smaller than n. If yes then the above process is performed repeatedly until the optimum write power levels have been calculated for all zones. If j is equal to or greater than n, the test light emitting operation for setting the optimum write power is completed.

In this way, the optimum write power levels P2(0), . . . , P2(n) for the respective zones, that is, the output currents Iw2 for the respective zones, are set.

(Advantages)

In this third embodiment, as described above, the output of the current-to-voltage converter 3 is directly applied to the A/D converter 9 without using the operational amplifier 5, the V0-D/A converter 6, the V2-D/A converter 7, the V2-D/A converter 8, the switches SW1, SW2, and Sw3, and the digital signal generated by the A/D converter 9 is applied to the CPU 51. Thus, in addition to the advantages provided by the first embodiment described above, the third embodiment also has the advantage that the circuit can be constructed in a further simplified fashion and thus at low cost.

Figure 10:
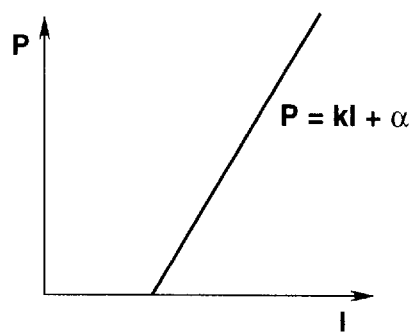
FIG. 10 is a graph illustrating the optical output power of a laser diode used in the respective embodiments of the invention as a function of the current passed through the laser diode.
Figure 11:
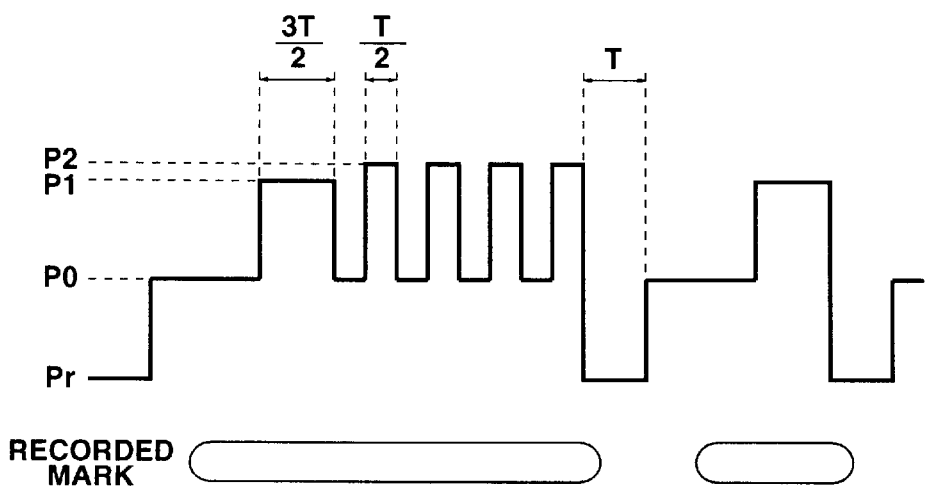
FIG. 11 is a waveform diagram illustrating a pulse waveform generated by a conventional semiconductor control circuit to drive a semiconductor laser.
Figure 12:
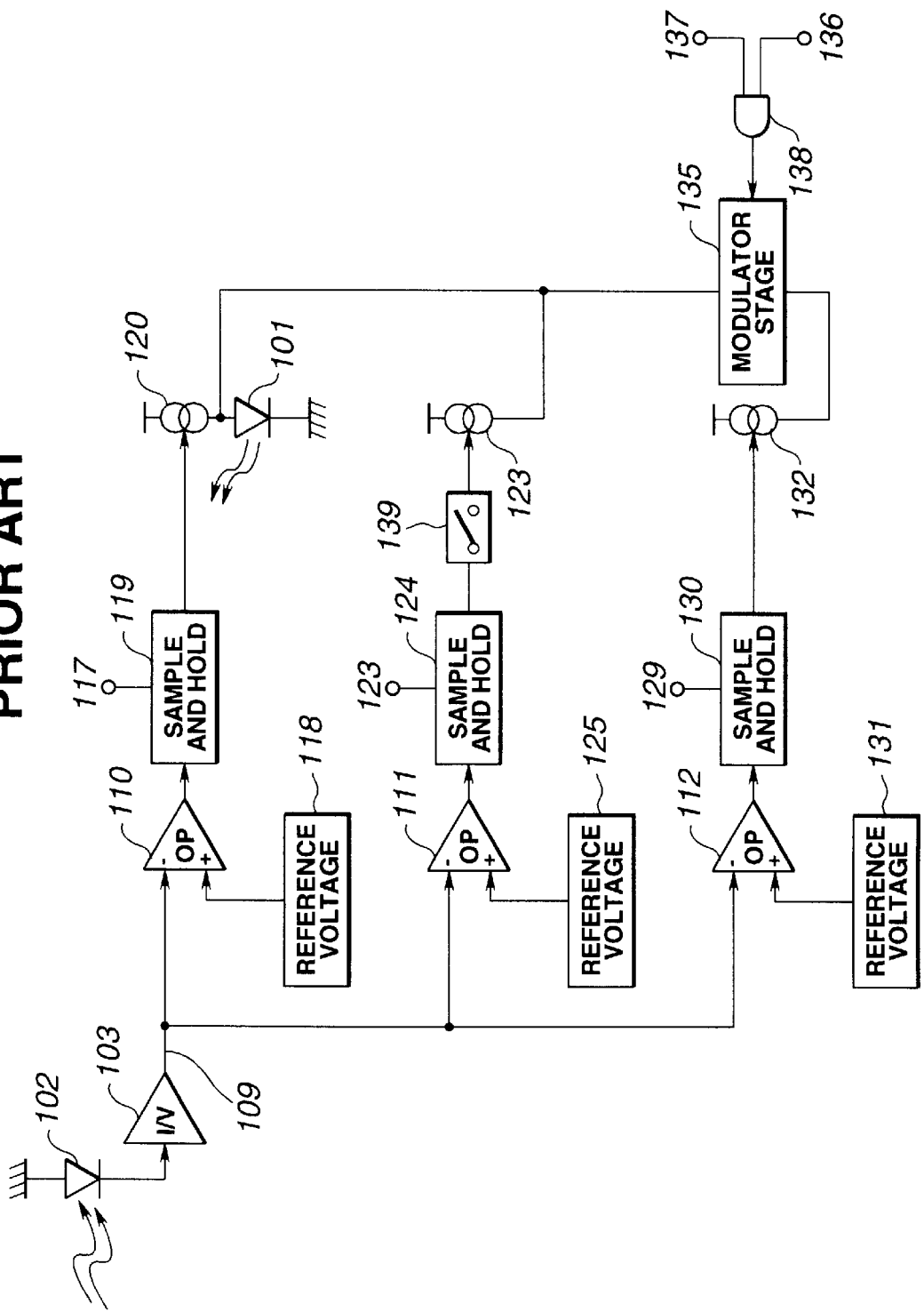
FIG. 12 is a circuit diagram illustrating the construction of the conventional semiconductor laser control circuit.

In each embodiment described above, the optical output of the laser diode varies as a linear function of the driving current (represented as $P=kI+\alpha$ where k and $\alpha$ are constants) as shown in FIG. 10. Therefore the test light emission may be performed only for a few points (two or more points) and other power levels may be calculated using the above linear function.

Although the present invention has been described above with reference to certain exemplary embodiments, various modifications are possible without departing from the spirit and the scope of the invention. Thus it should be understood that the invention is limited only by the scope of the appended claims.

I claim:

1. A semiconductor control circuit comprising:

a semiconductor laser for illuminating an optical recording medium with a laser beam;

a plurality of pulse current supplying means for supplying a semiconductor laser driving current to said semiconductor laser thereby driving said semiconductor laser;

current setting means for setting said semiconductor laser driving current of said plurality of pulse current supplying means;

control means for controlling the setting operation of said current setting means;

photo detector means for detecting the laser beam emitted by said semiconductor laser; and current-to-voltage conversion means for converting a current signal supplied from said photo detector means into a voltage signal;

wherein said control means specifies in advance the setting value to which said semiconductor laser driving current should be set by said current setting means in a predetermined area of said optical recording medium; compares the output of said current-to-voltage conversion means with predetermined data; corrects said setting value of said current setting means in accordance with the comparison result; stores the corrected setting value; and controls the setting operation performed by said current setting means in a recording area of said optical recording medium in accordance with said stored setting value.

2. A semiconductor control circuit comprising:

a semiconductor laser for illuminating an optical recording medium with a laser beam;

a plurality of pulse current supplying means for supplying a semiconductor laser driving current to said semiconductor laser thereby driving said semiconductor laser;

current setting means for setting said semiconductor laser driving current of said plurality of pulse current supplying means;

control means for controlling the setting operation of said current setting means;

photo detector means for detecting the laser beam emitted by said semiconductor laser;

current-to-voltage conversion means for converting a current signal supplied from said photo detector means into a voltage signal;

one or more reference value setting means for setting the reference value in terms of the optical output power of said semiconductor laser; and comparison means for comparing the output of said current-to-voltage conversion means with said reference value in terms of the optical output power;

wherein said control means specifies in advance the setting value to which said semiconductor laser driving current should be set by said current setting means in a predetermined area of said optical recording medium; compares the output of said comparison means with predetermined data; corrects said setting value of said current setting means in accordance with the comparison result; stores the corrected setting value; and controls the setting operation performed by said current setting means in a recording area of said optical recording medium in accordance with said stored setting value.

3. A semiconductor laser control circuit according to claim 1 or 2, wherein at least one of said plurality of pulse current supplying means is read current supplying means for supplying a read current by which information is read from said optical recording medium; and the semiconductor laser driving currents supplied by said plurality of pulse current supplying means other than said read current supplying means are superimposed on the semiconductor laser driving current supplied by said read current supplying means.

4. A semiconductor laser control circuit according to claim 3, wherein said control means controls the operation of superimposing of said semiconductor laser driving currents supplied by said plurality of pulse current supplying means other than said read current supplying means on said semiconductor laser driving current supplied by said read current supplying means.

5. A semiconductor laser control circuit according to claim 1 or 2, wherein said predetermined area of the optical recording medium is a test zone or a manufacturer zone formed in an inner or outer area other than user areas of said optical recording medium.

6. A method of controlling a semiconductor laser diode, comprising:

a first step of specifying in advance the setting value of a semiconductor laser driving current by which said semiconductor laser is driven, the operation of specifying said setting value being performed in a predetermined area of an optical recording medium;

a second step of detecting the optical output power of said semiconductor laser, comparing said detected optical output power with a reference value, and then comparing the result of said comparison with predetermined data;

a third step of correcting said setting value on the basis of the comparison result obtained in said second step and storing the corrected setting value; and a fourth step of controlling the process of setting said setting value for a recording area of said optical recording medium on the basis of said setting value stored in said third step.

7. A method of controlling a semiconductor laser, according to claim 6 wherein said predetermined area of the optical recording medium is a test zone or a manufacturer zone formed in an inner or outer area other than user areas of said optical recording medium.

* * * * *